(12) United States Patent
Yang et al.

(10) Patent No.: US 8,841,871 B2
(45) Date of Patent: Sep. 23, 2014

(54) CONTROL CIRCUIT AND METHOD FOR MANIPULATING A POWER TOOL

(75) Inventors: Dezhong Yang, Nanjing (CN); Zheng Geng, Jiangsu Province (CN)

(73) Assignee: Chervon (HK) Limited, Wanchai (HK)

( * ) Notice: Subject to any disclaimer, the term of this patent is extended or adjusted under 35 U.S.C. 154(b) by 528 days.

(21) Appl. No.: 13/154,549

(22) Filed: Jun. 7, 2011

(65) Prior Publication Data

US 2011/0304287 A1  Dec. 15, 2011

(30) Foreign Application Priority Data

Jun. 9, 2010  (CN) .......................... 2010 1 0199754
Jun. 11, 2010  (CN) .......................... 2010 1 0204598

(51) Int. Cl.
*H02P 6/00*  (2006.01)

(52) U.S. Cl.
USPC ....................... 318/400.08; 318/471; 388/937

(58) Field of Classification Search
USPC ........ 388/937; 318/432, 434, 400.08, 400.21, 318/471
See application file for complete search history.

(56) References Cited

U.S. PATENT DOCUMENTS

| | | | | |
|---|---|---|---|---|
| 6,229,280 B1* | 5/2001 | Sakoh et al. | ................... | 320/106 |
| 6,324,339 B1* | 11/2001 | Hudson et al. | ................ | 388/809 |
| 7,135,791 B2* | 11/2006 | Kushida et al. | ................ | 307/150 |
| 7,157,882 B2* | 1/2007 | Johnson et al. | ................ | 320/134 |
| 2006/0091858 A1* | 5/2006 | Johnson et al. | ................ | 320/128 |
| 2007/0193762 A1* | 8/2007 | Arimura et al. | ................ | 173/217 |
| 2009/0229842 A1* | 9/2009 | Gray et al. | ......................... | 173/20 |
| 2011/0240320 A1* | 10/2011 | Umemura et al. | .............. | 173/46 |

* cited by examiner

*Primary Examiner* — Rina Duda
(74) *Attorney, Agent, or Firm* — McDermott Will & Emery LLP (57) ABSTRACT

The present application discloses a control circuit for a power tool and a method for manipulating the power tool. The control circuit has a detection circuit for battery packs, a calculating control circuit, a battery capacity indicating circuit for indicating the calculation result of the battery capacity, and a current measure and calculating circuit for measuring the current flowing through motors. The calculation result further includes the voltages consumed by the battery pack internally and the discharge loop. The method for manipulating the power tool includes pressing the switch to electrically connect the motor and the battery pack, measuring the parameters of the battery pack and allowing the motor to operate or not according the measured parameters. Further, after the motor is in operation, the battery capacity is calculated and the results are displayed.

6 Claims, 8 Drawing Sheets

CONTROL CIRCUIT AND METHOD FOR MANIPULATING A POWER TOOL

CROSS-REFERENCE TO RELATED APPLICATIONS

This application claims priority to CN 201010199754.6, filed Jun. 9, 2010, and CN 201010204598.8, filed Jun. 11, 2010, which are hereby incorporated by reference.

FEDERALLY SPONSORED RESEARCH OR DEVELOPMENT

Not Applicable.

TECHNICAL FIELD

The present application relates to a control circuit for a power tool and a method for manipulating the power tool.

BACKGROUND OF THE INVENTION

Generally, a power tool having a battery pack has the ability to display the remaining battery capacity. In ordinary situations, the displayed remaining battery capacity is obtained by directly measuring the voltage between the two ends of the battery. When the battery is discharging, the temperature of the battery increases and the inner resistance varies according to the temperature. Because of the variance, the measured voltage does not always accurately reflect the energy of the battery for the motor and results in an incorrect display of the remaining battery capacity.

Also, this kind of detecting and indicating may be performed before the battery pack is used to drive the motor to operate. After the motor starts operating, the battery capacity indicating device may be turned off. As a result, when the power tool starts operating, the user does not know the remaining battery capacity of the battery pack. Because the parameters of the battery pack are not monitored during use, if the battery pack is over-current or over-temperature, the power tool will not create an alert or stop operating, which could harm a user.

SUMMARY OF THE INVENTION

To overcome the disadvantages and deficiencies of the prior art, the present application provides a control circuit for a power tool and a method for manipulating the power tool to address these problems.

To achieve the above-mentioned objectives, the control circuit for a power tool disclosed by the present application may have a detection circuit for a battery pack electrically connected with a battery pack and configured to measure the voltage V' between two measuring points at the two ends of the battery pack and measure the temperature of the battery. It may also have a calculating control circuit configured to calculate and obtain a calculation result of battery capacity according to the voltage between the two ends of the battery pack measured by the detection circuit for the battery pack. The calculating control circuit may also be configured to control the power supply for the motor in conjunction with at least the temperature of the battery pack. The calculation result may be the open circuit voltage V of the battery pack, and the battery capacity indicating circuit may be configured to indicate the calculation result of battery capacity. It may also have a current measuring circuit configured to measure the current I flowing through the motor, and the calculation result of battery capacity of the calculating control circuit may further include the voltage consumed by the battery pack both internally and in the discharge loop.

The control circuit considers the variation of the resistance of the discharge loop of the battery due to the increase of the temperature resulting from the battery discharge and the voltage of the discharge loop of the battery. This allows for the measured voltage of the battery pack to be closer to the real voltage of the battery pack and results in the display of the remaining battery capacity to be more accurate.

The application also provides a method for manipulating the power tool to improve these problems. The method for manipulating the power tool disclosed by the application includes pressing a switch to electrically connect the motor and the battery pack and then measuring parameters of the battery pack and controlling the motor to operate or stop according to the measured parameters. It also includes calculating the battery capacity after the motor is in operation and displaying a calculation result of the battery capacity on the battery capacity indicating device.

The method for controlling may also include detecting and judging the various parameters of the battery before the motor is put in operation which could avoid an impact on the motor caused by an abnormal status of the battery and avoid an emergency. The method may also include calculating and displaying the remaining battery capacity after the motor starts operating, and repeating the detecting and judging of the various parameters of the battery and the calculating and displaying of the remaining battery capacity which would monitor the operational status of the battery in real time and make the discharge of the battery safer. The detecting and displaying of the remaining battery capacity in real time also makes the display of the remaining battery capacity more accurate.

BRIEF DESCRIPTION OF THE DRAWINGS

To understand the present application, it will now be described by way of example, with reference to the accompanying drawings in which.

DETAILED DESCRIPTION

Figure 1:
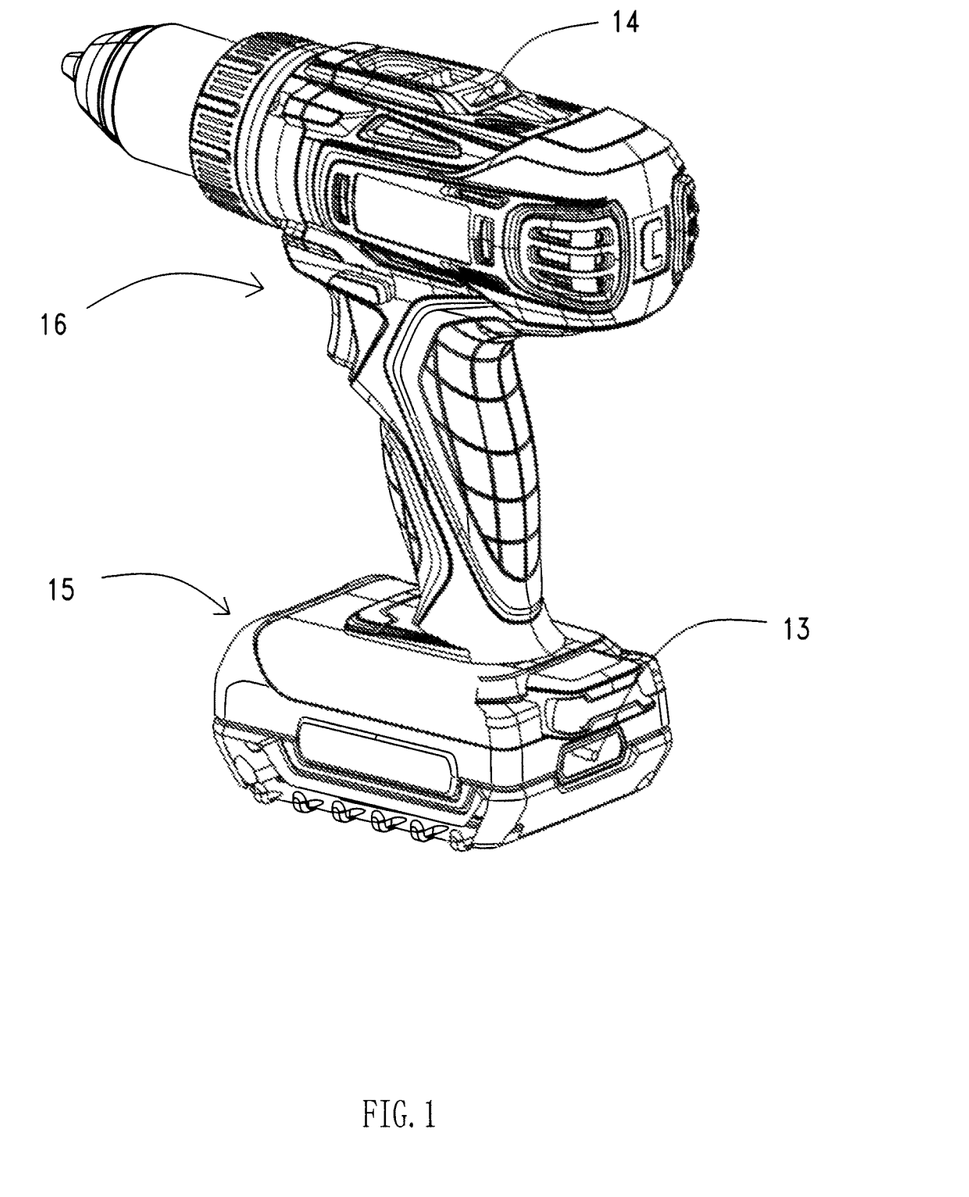
FIG. 1 is a perspective view of a power tool according to the present application.

The invention will now be explained with reference to the drawings and examples below. In ordinary operationing situations, the DC power tool comprises a switch, a battery pack containing multiple rechargeable batteries, and a motor installed in the housing of the tool. Battery capacity displaying devices, for displaying the status of the battery pack capacity, are installed on the body of the tool and the battery pack. Using electrical drills as an example, as shown in FIG. 1, both the body 16 of the electrical drill and the battery pack 15 have battery capacity indicators. A body battery capacity indicator 14 is installed on the top of the body 16 of the tool, and a battery pack capacity indicator 13 is installed at the rear side of the battery pack 15. The battery pack capacity indicator 13 and the body battery capacity indicator 14 are preferably bicolor LED lamps in red and green which are capable of displaying three colors. The lamps display red when the red LED lamp is on, green when the green LED lamp is on, and orange when both of the red LED lamp and the green LED lamp are on. In the present example, the green lamp indicates that the remaining battery capacity of the battery pack is in "full" state, orange lamp indicates that it is in "medium" state, and red lamp indicates that it is in "low" state. The LED indicating lamps could also be replaced by an LCD display.

Figure 2:
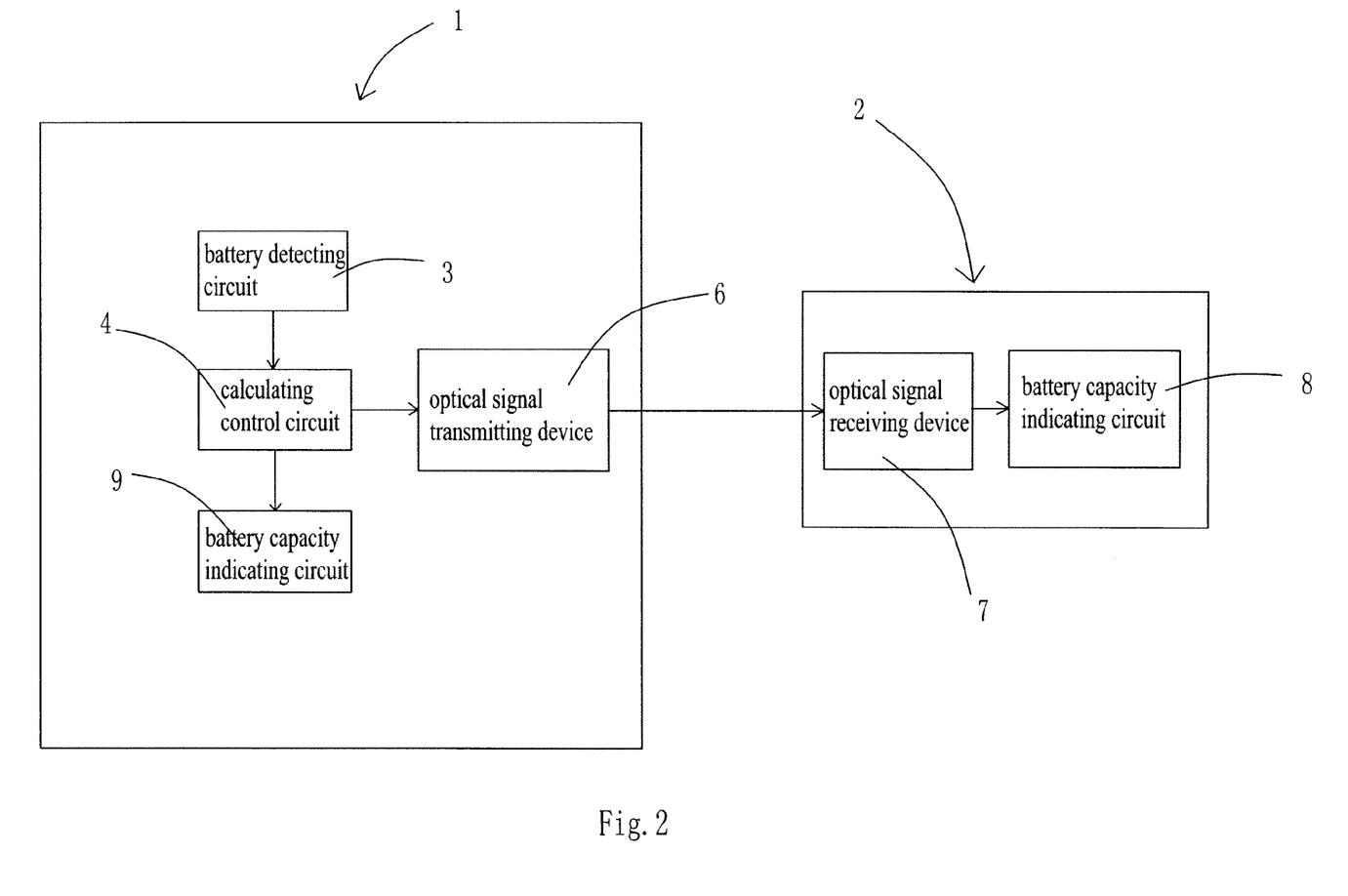
FIG. 2 is a block diagram of a battery capacity displaying circuit of a power tool according to the present application.

FIG. 2 shows a circuit diagram of the battery capacity displaying circuit of the DC power tool. The displaying circuit comprises a first circuit module 1 and a second circuit module 2, wherein the first circuit module 1 is positioned on the battery pack, and comprises a battery detection circuit 3, a calculating control circuit 4, a battery capacity indicating circuit 9, and an optical signal transmitting device 6. The second circuit module 2 is positioned on the body of the tool, and comprises an optical signal receiving device 7 and a battery capacity indicating circuit 8.

When the battery capacity multi-position displaying circuit is in operation, in the first circuit module 1 on the battery pack, the battery detection circuit 3 will detect each of the voltage of the battery, the temperature of the battery and the discharge current of the battery. The battery detection circuit 3 then feeds the detection results to the calculating control circuit 4. The calculating control circuit 4 calculates and judges the detection results, and feeds the calculation results to the battery capacity indicating circuit 9 which includes a capacity indicator, so as to display the remaining battery capacity. The specific method of detecting and calculating will be elucidated below. The capacity signal is sent to the optical signal receiving device 7 on the body by the optical signal transmitting device 6. The optical signal receiving device 7 feeds the signal received to the battery capacity indicating circuit 8.

Preferably, the optical signal transmitting device 6 is a photoelectric signal transmitting circuit, and the optical signal receiving device 7 is a photoelectric element. The calculation results generated by the calculating control circuit 4 are provided to the optical signal transmitting device 6 in the form of a signal of a high-low electrical level. The optical signal transmitting device 6 sends the level signals to the second circuit module 2 through photoelectric transmitting means. The optical signal receiving device 7 in the second circuit module 2 is configured to receive the photoelectric signals transmitted by the first circuit module 1 on the battery pack, and to provide them to the battery capacity indicating circuit 8. The battery capacity indicating circuit 8 contains a battery capacity indicating device, which in the present example is a bicolor LED lamp, and controls the bicolor LED lamp to display different colors according to a signal of a different level. In an alternative example, the battery capacity indicating circuit 8 displays on an LCD displayer in the form of digit, histogram lamp, or others, so as to indicate the remaining capacity of the battery.

Figure 3A:
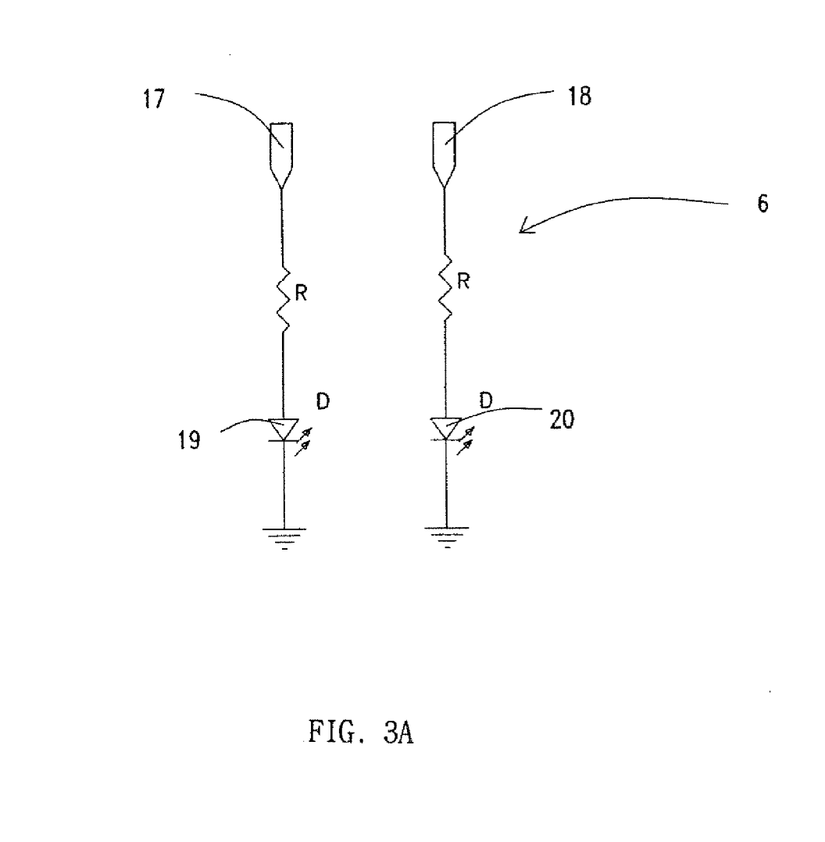
FIG. 3A is a principle diagram of a photoelectric signal transmitter of a power tool according to the present application.
Figure 3B:
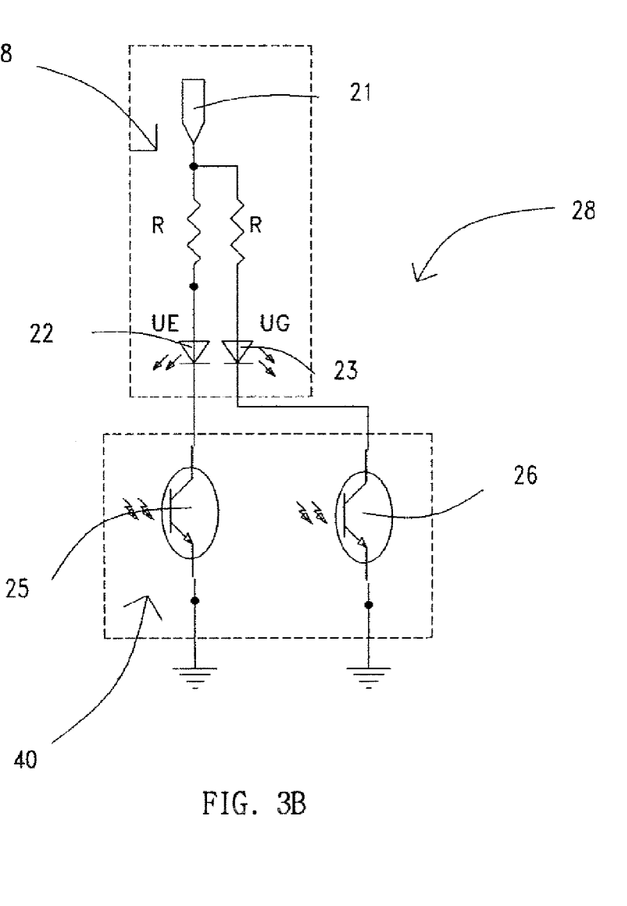
FIG. 3B is a principle diagram of a receiver of a power tool according to the present application.

As shown in the principle diagram of the photoelectric signal transmitter and receiver in FIGS. 3A and 3B, respectively, the transmitter and receiver of the photoelectric signals comprise a photoelectric signal transmitting circuit 39 on the battery pack and a photoelectric signal receiver and displaying circuit 28. The photoelectric signal transmitting circuit 39 includes photoelectric elements 19, 20 for transferring the electrical signal to an optical signal and then transmitting the optical signal. The photoelectric signal receiving and displaying circuit 28 includes photoelectric element 40, for receiving and transferring the optical signal to an electrical signal for display by the battery capacity indicating circuit 8. The photoelectric element can be a photoconductive resistor, an infrared transmitting and receiving element, a PIN diode, etc. The current example uses an infrared transmitting element and infrared receiving element. The photoelectric signal transmitting circuit 39 used by the present application includes infrared transmitting tubes 19, 20 for transmitting the optical signal. The photoelectric signal receiving and displaying circuit 28 includes a photoelectric element 40 and battery capacity indicating circuit 8 which includes a power source 21 and a battery capacity indicator. The photoelectric element 40 includes infrared receiving tubes 25, 26. The battery capacity indicator includes battery capacity indicating circuit 8 and LED lamps 22, 23. The infrared receiving tubes 25, 26 receive either of the two branches of infrared signals, so as to respectively control the operation of LED lamp 22 and LED lamp 23.

When the photoelectric signal transmitting circuit 39 and the photoelectric signal receiving and displaying circuit 28 are connected, the control ends 17, 18 in the photoelectric signal transmitting circuit 39 receive two branches of level control signals from the calculating control circuit 4, and the photoelectric signal transmitting circuit 39 converts the level control signals to optical signals and transmits them. Once received by the photoelectric signal receiving and displaying circuit 28, the optical signals are converted to level signals and are used to cause the control and display device to display a corresponding result. When both of the two branches of control signals received by the photoelectric signal transmitting circuit 39 are at a high level and the circuits are on, the infrared signal transmitting tubes 19 and 20 transmit infrared signals, and the infrared signal receiving tubes 25 and 26 in the photoelectric signal receiving and displaying circuit 28 receive infrared signals. As a result, the LED lamp 22 and LED lamp 23 are also on. However, when both of the two branches of control signals are at a low level, the infrared signal transmitting tubes 19 and 20 do not transmit infrared signals, and the infrared signal receiving tubes 25 and 26 are off, and therefore the LED lamp 22 and LED lamp 23 are also off. When one of the two branches of control signals is at a high level and the other is at a low level, the LED lamp in the same loop of the infrared signal receiving tube receives the high level signal and is therefore on, while the LED lamp in the same loop of the infrared signal receiving tube receives the low level signal and is therefore off.

In another example, the optical signal transmitting and receiving structure can be realized by a fiber-optic apparatus. As shown in the structure diagram of a fiber-optic apparatus in FIG. 4, the fiber-optic apparatus may include a first optical guiding element 36 which is in the battery pack 15 and is used as an optical signal transmitting apparatus with a second optical guiding element 37 in the body 16 being used as optical signal receiving apparatus. The first optical guiding element 36 is formed of an optical guiding fiber 36c and an optical guiding cylinder 36b. There is a first optical guiding surface 36a on the end of the optical guiding fiber 36c close to the body 16, and on the other end of the optical guiding fiber 36c connected to the optical guiding cylinder 36b. The second optical guiding element 37 is formed of optical guiding fiber 37c and optical guiding cylinder 37b. There is also a first optical guiding surface 37a on the end of the optical guiding fiber 37c close to the battery pack 15 and on the other end of the optical guiding fiber 37c connected to the optical guiding cylinder 37b. The optical guiding cylinder 36b of the first optical guiding element 36 corresponds with the battery pack capacity indicator 13 for transmitting the optical signals from battery pack capacity indicating lamps. This is convenient for the conduction of the optical guiding fiber 36c, 37c. The optical guiding cylinder 37b of the second optical guiding element 37 corresponds with the body capacity indicator 14 for transmitting the optical signals from optical guiding fiber 37c and is convenient for the display of body capacity indicator 14.

Figure 4:
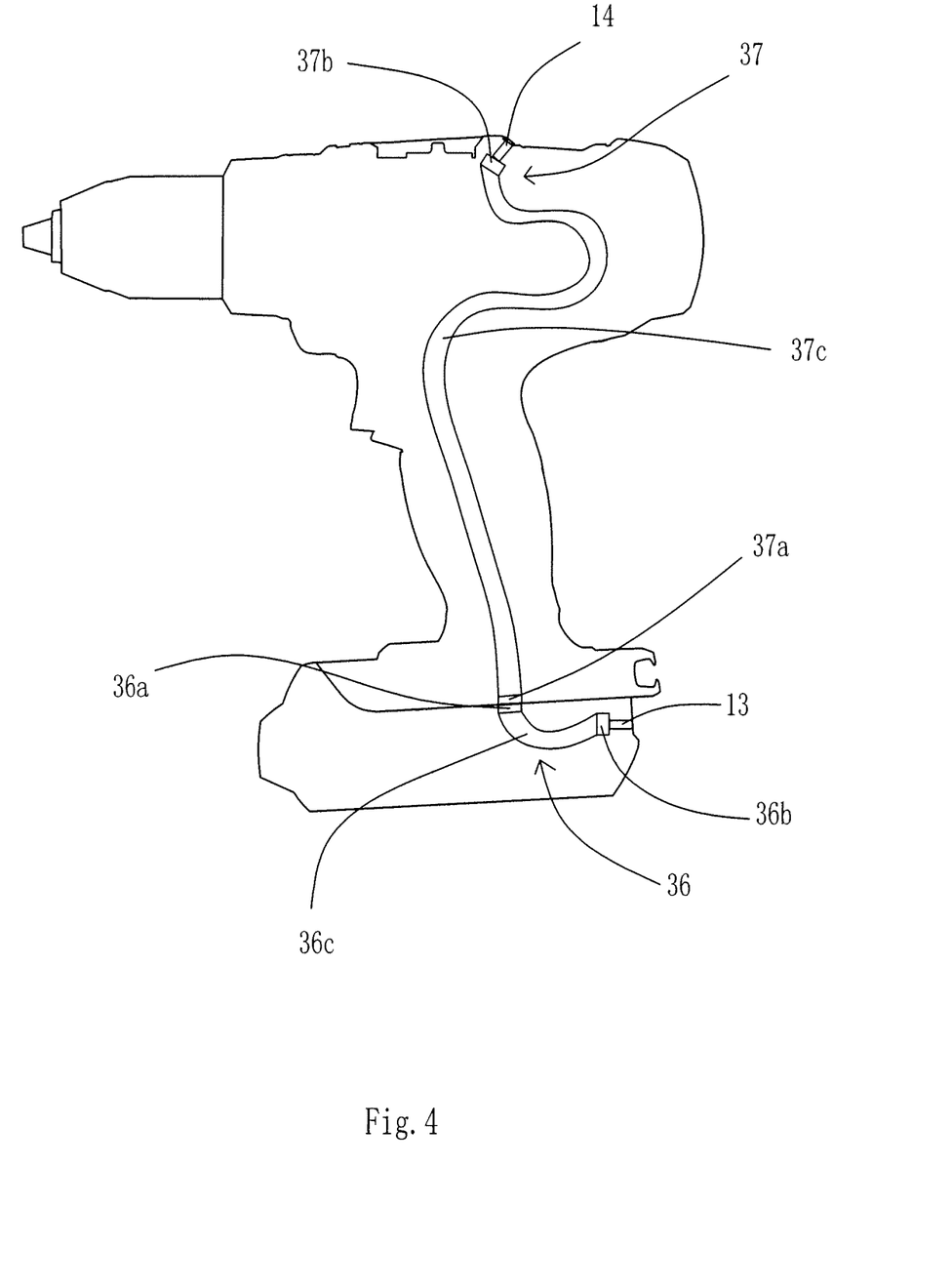
FIG. 4 is a structural diagram of a fiber-optic apparatus of a power tool according to the present application.

After battery pack 15 has been installed on body 16, the first optical guiding surface 36a of the first optical guiding element 36 and the second optical guiding surface 37a of the second optical guiding element 37 are facing each other, and the optical signals can be transferred between the optical guiding fibers 36c, 37c. The optical signals from battery pack capacity indicator 13 are transferred to the body 16 through the optical guiding fiber 36c, 37c via the optical guiding cylinder 36b. The optical signals are transferred using optical guiding cylinder 37b of the second optical guiding element 37 and are then passed on to the body battery capacity indicator 14 to make the body battery capacity indicator 14 irradiate and make the light radiated by the body battery capacity indicator 14 in accordance with the optical signals radiated by the battery pack capacity indicator 13.

Since battery capacity indicating devices are installed on both the battery pack and the body of the tool, the operator can observe the remaining capacity indicating device from any convenient angle during operation of the tools and the remaining capacity can be known at any time. Also, the battery capacity indicating devices on the battery pack and the body of the tool display the output from the same battery detection circuit and calculating control circuit which results in the two signals being in sync with each other. Compared with traditional communication means, the photoelectric transmitting and receiving means and the fiber-optic transmission means are more resistant to interferences resulting in a more stable and accurate signal. As an added benefit, the above described signal transmitting and receiving means are provided with lower apparatus costs when compared with traditional communication transmitting and receiving structures.

Figure 5:
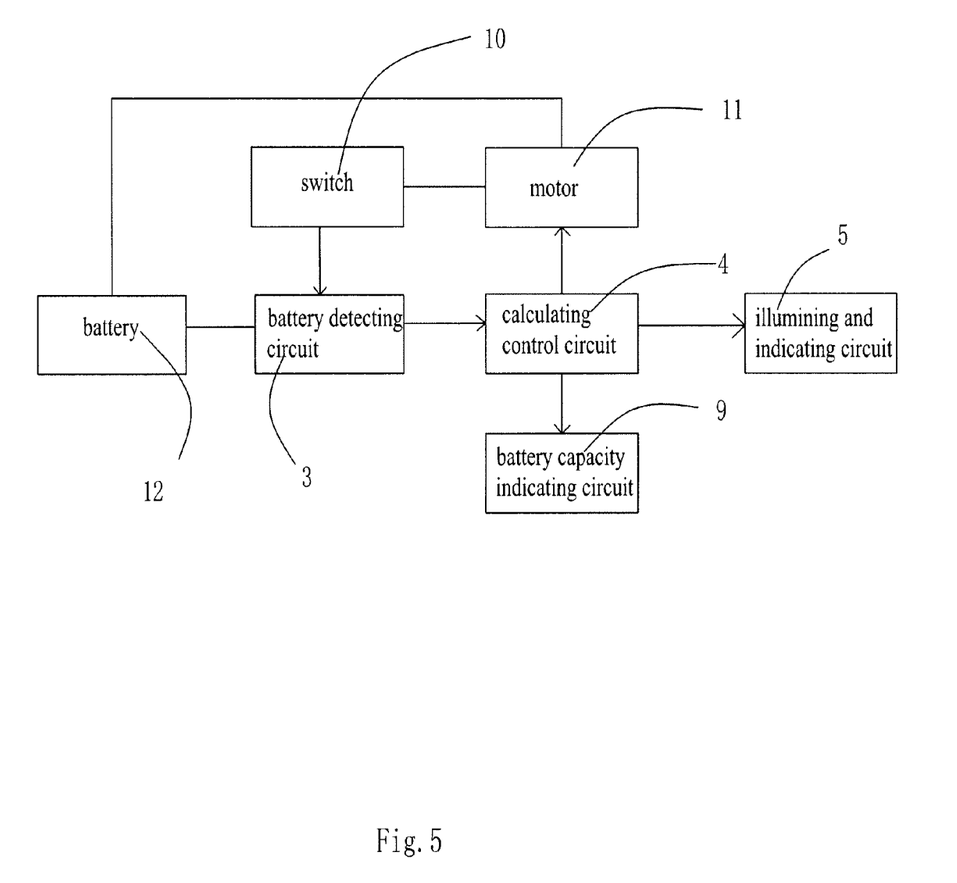
FIG. 5 is a block diagram of a control circuit of a power tool according to the present application.

FIG. 5 is a block diagram of the power tool control circuit. The circuit comprises a switch 10, a motor 11, a battery detection circuit 3, a calculating control circuit 4, a battery 12 and a battery capacity indicating circuit 9. The power tool control circuit is the circuit which is positioned in the battery pack, and detects, calculates and indicates the remaining capacity of the battery pack and further controls the work of the motor.

When the power tool control circuit is in operation, the operator presses the switch 10 of the power tool, and the battery detection circuit 3 starts detecting. The battery detection circuit 3 comprises the detection of the voltage, current and battery temperature of the battery 12, and feeds the detection results to the calculating control circuit 4 after the detecting is done. The calculating control circuit 4 comprises a semiconductor switch and a CPU for carrying out the calculating, judging and controlling. The CPU can also be replaced by micro controllers such as MCU or ARM, and the semiconductor switch can also be replaced by MOSFET. The CPU compares, calculates and judges the voltage, current and battery temperature detected by the battery detection circuit 3 respectively within a predefined voltage value, predefined current value and predefined battery temperature value. The CPU feeds a control signal after the calculating and the judging to the motor 11, the battery capacity indicating circuit 9 and the illumining and indicating circuit 5, so as to control whether the motor 11 operates or not, to control the state of display of the battery capacity indicating circuit 9 and to control the operation status of the illumining lamp. The specific procedures of comparing, calculating and judging will be elucidated below.

Figure 6:
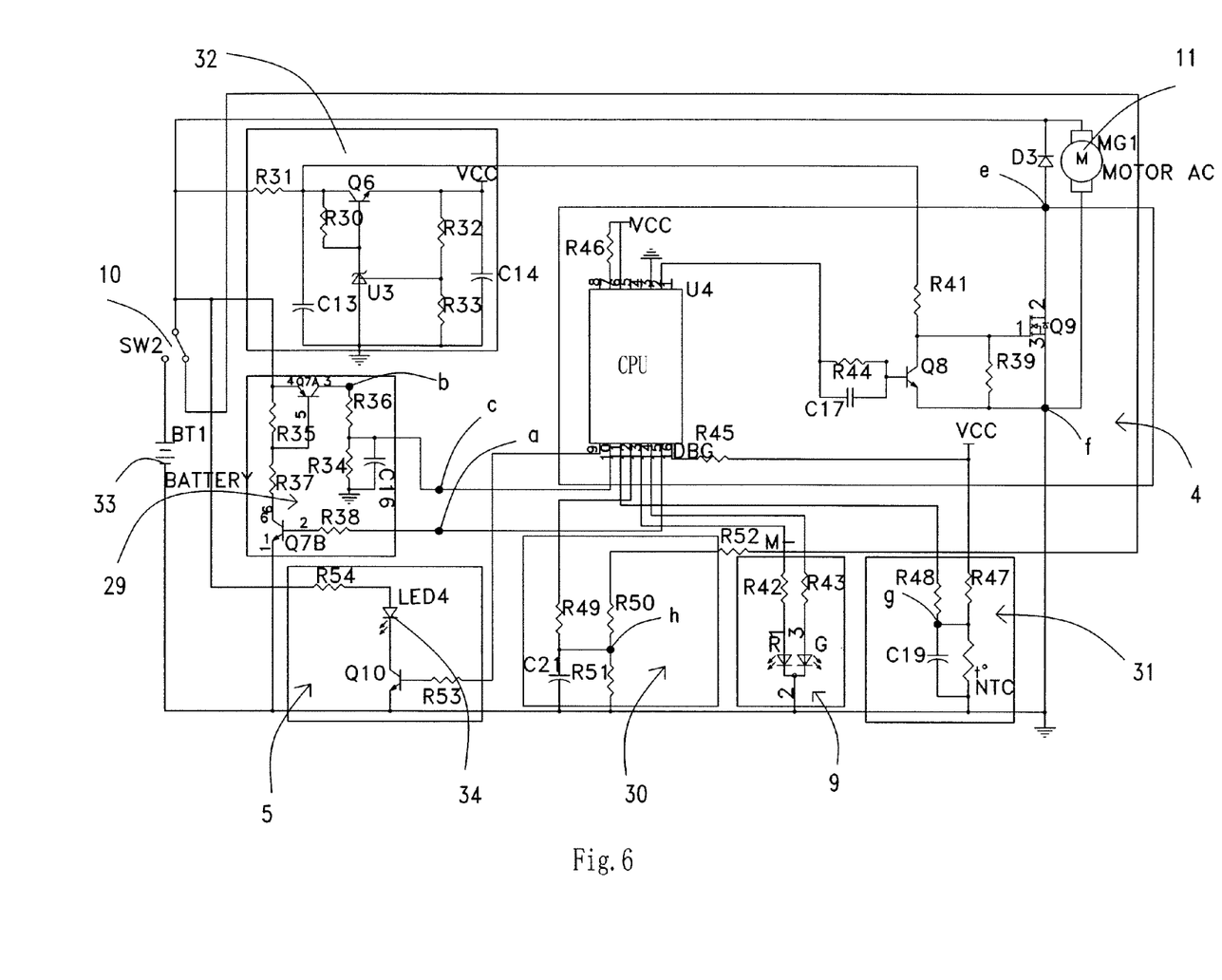
FIG. 6 is a circuit diagram of a control circuit of a power tool according to the present application.

FIG. 6 is a specific circuit diagram of the power tool control circuit, and the circuit comprises a battery pack 33, a switch 10, a motor 11, a calculating control circuit 4, a battery capacity indicating circuit 9, an illumining and indicating circuit 5, a power circuit 32, and a battery detection circuit constituted by a voltage detection circuit 29, a current measure and calculate circuit 30 and a battery temperature detection circuit 31.

The power circuit 32 provides operational power for every circuit in the power tool control circuit except for the motor 11 and the illumining and indicating circuit 5. Wherein, a base voltage source U3 cooperates with the transistor Q6 to form a constant voltage. The resistors R32, R33 and R30 adjust the voltage, applied on the two ends of every circuit except for the motor 11 and the illumining and indicating circuit 5, to the required stable voltage value. Generally, the battery pack 33 provides unstable voltage varying from 8.1V to 12.4V, and the voltage is adjusted as a stable voltage of 3.3V after being decreased and regulated by the power circuit 32.

In the voltage detection circuit 29, after the switch 10 is closed, point a is in the high electrical level, and the transistor Q7B is saturated and on, thus the transistor Q7A is saturated and on. The voltage of the battery pack 33 is applied to point b, and is divided by R34 and C16. The pin 11 of the CPU measures the voltage at point c, thus the CPU calculates the voltage at point b, namely the voltage value of the battery pack 33. And the voltage detected by voltage detection circuit 29 is the voltage of battery 33, switch, and lead wires.

In the battery temperature detection circuit 31, a temperature sensor $t_{NTC}$ is a thermal resistor and attached to the outer wall of the batter pack. The pin 11 of the CPU measures the voltage at point g after the voltage is divided by R47 and $t_{NTC}$, so as to obtain the temperature of the battery. If the battery pack is over-temperature, the resistance of the temperature sensor $t_{NTC}$ decreases. Thus, the CPU judges whether the battery pack is over-temperature according to the voltage at the point g.

In the current measure and calculate circuit 30, the pin 12 of the CPU measures the voltage at point h and obtains the voltage between two ends e and f of Q9 according to the voltage-dividing relationship of R50 and R51. Given the on resistance of Q9, the CPU calculates the current value I of the battery pack. When the CPU determines that the voltage value, the temperature value and the current value of the battery pack meet the start requirement of the motor 11, the pin 2 of the CPU outputs a low electrical level, the transistor Q8 is cut off, and the voltage at point d is applied on the pin 1 of the FET Q9, so that the Q9 is saturated and on, and motor 11 operates. In other embodiments, the current measure and calculate circuit 30 can be separated from the battery detection circuit.

In the illumining and indicating circuit 5, the control signal is provided by pin 9 of the CPU. When the control signal keeps at high level, transistor Q10 is on and the illumining and indicating lamp 34 is on when the control signal is at low level or doesn't exist, the transistor Q10 is cut off, and the illumining and indicating lamp 34 is off. When the control signal alternates between high level and low level, the transistor Q10 is on and cut off alternately, and the illumining and indicating lamp 34 flickers. When the illumining and indicating lamp 34 is a white LED lamp, it provides illumining source for the power tool in normal situations but flickers to provide alert signals when the power tool is in abnormal status.

Figure 7:
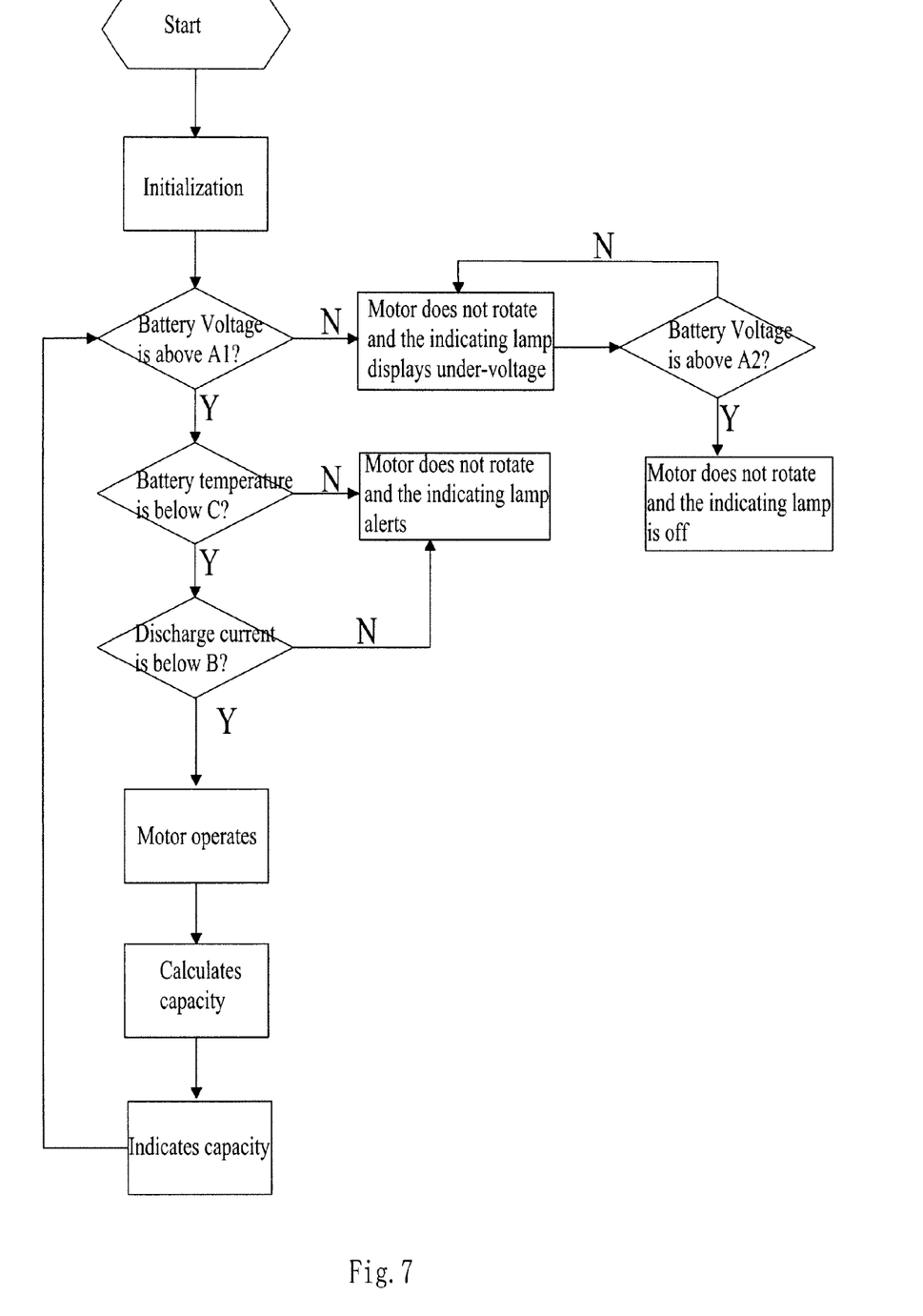
FIG. 7 is a flowchart of a control circuit of a power tool according to the present application; and, FIG. 8 is a circuit diagram of a battery capacity calculating circuit according to the present application.

FIG. 7 is a flowchart of the power tool control circuit. After the remaining battery capacity displaying circuit starts operating, the program first initializes the CPU responsible for the calculating and then carries out the judging for the battery voltage. If the battery voltage is below a predefined voltage value A1 of all the batteries, the CPU outputs a low level signal to the semiconductor switch. Thus, the semiconductor switch is off and the motor won't work. The CPU sends a judging signal to the battery capacity indicating circuit 9 at the same time, and the red LED lamp is on to indicate the under-voltage of the battery. Further, the CPU could divide the measured voltage value by the number of the battery units, and obtain the voltage of one single battery. If the voltage of one single battery is below a predefined voltage value A2 of one single battery, the red LED lamp is off; and if the voltage of one single battery is above the predefined voltage value A2 of one single battery, the red LED lamp keeps on, and the comparing and judging for the voltage value of one single battery may be repeated at the same time.

If the battery voltage is above or equal to the predefined voltage value Al of all the batteries, the CPU outputs a high level signal to the semiconductor switch. Then the semiconductor switch is on, and the program proceeds to judge the discharge temperature of the battery.

If the battery temperature is above or equal to the predefined value C, the CPU outputs a low level signal to the semiconductor switch. Thus the semiconductor switch is off and the motor won't operate. Meanwhile the CPU sends a judging signal to the illumining and indicating circuit 5, and the illumining and indicating lamp 34 keeps flickering to alert. At this time, the battery is in the state of over-temperature, and the alert from the illumining lamp could make the user notice this situation of over-temperature, so as to avoid the battery pack from causing danger due to over-temperature.

If the battery temperature is below the predefined value C, the CPU outputs a high level signal to the semiconductor switch. Thus, the semiconductor switch is on, the motor operates, and the program proceeds to judge the discharge current of the battery.

If the discharge current of the battery is above or equal to a predefined value B, the CPU outputs a low level signal to the semiconductor switch. Thus, the semiconductor switch is off and the motor stops operating. Meanwhile the CPU sends a judging signal to the illumining and indicating circuit 5, and the illumining and indicating lamp 34 keeps flickering to alert the user. When the discharge circuit is in the state of over-current, and problems such as motor damage would be caused if the motor kept operating in this situation, the alert from the illumining lamp could notify the user of over-current, so as to avoid the motor from being damaged. If the battery temperature is below the predefined value B, the CPU outputs a high level signal to the semiconductor switch. Thus, the semiconductor switch is on and the motor keeps operating and the program proceeds to calculate the battery capacity.

In the calculation of the battery capacity, voltage is used to calculate the capacity. Generally, the discharge loop of the battery pack includes several internal resistances like battery pack internal resistance, contact pin internal resistance, contact wine internal resistance, loop internal resistance, etc. In this invention, contact pin internal resistance, contact wine internal resistance, and the internal resistance of copper foil of PCB compositively relate to $R_c$, and the battery pack internal resistance relates to $R_b$. As the circuit diagram of the capacity calculating circuit shows in FIG. 8, it comprises a battery pack 33, a switch 10, a motor 11, semiconductor switch 35, and loop internal resistance $R_c$ in which battery pack 33 includes battery 38 and battery pack internal resistance $R_b$, semiconductor switch 35 includes MOSFET Q9 and semiconductor switch internal resistance $R_{mos}$. As a result of the resistance having different resistance values at different temperatures, a temperature compensation coefficient $C_t$ can be pre-established for measuring and calculating the battery pack internal resistance $R_b$ exactly and counterbalance the deviation of the battery packs internal resistance value from the temperature. The temperature compensation factor $C_t$ is the measure and coefficient of the battery pack internal resistance when the battery pack is working normally.

Figure 8:
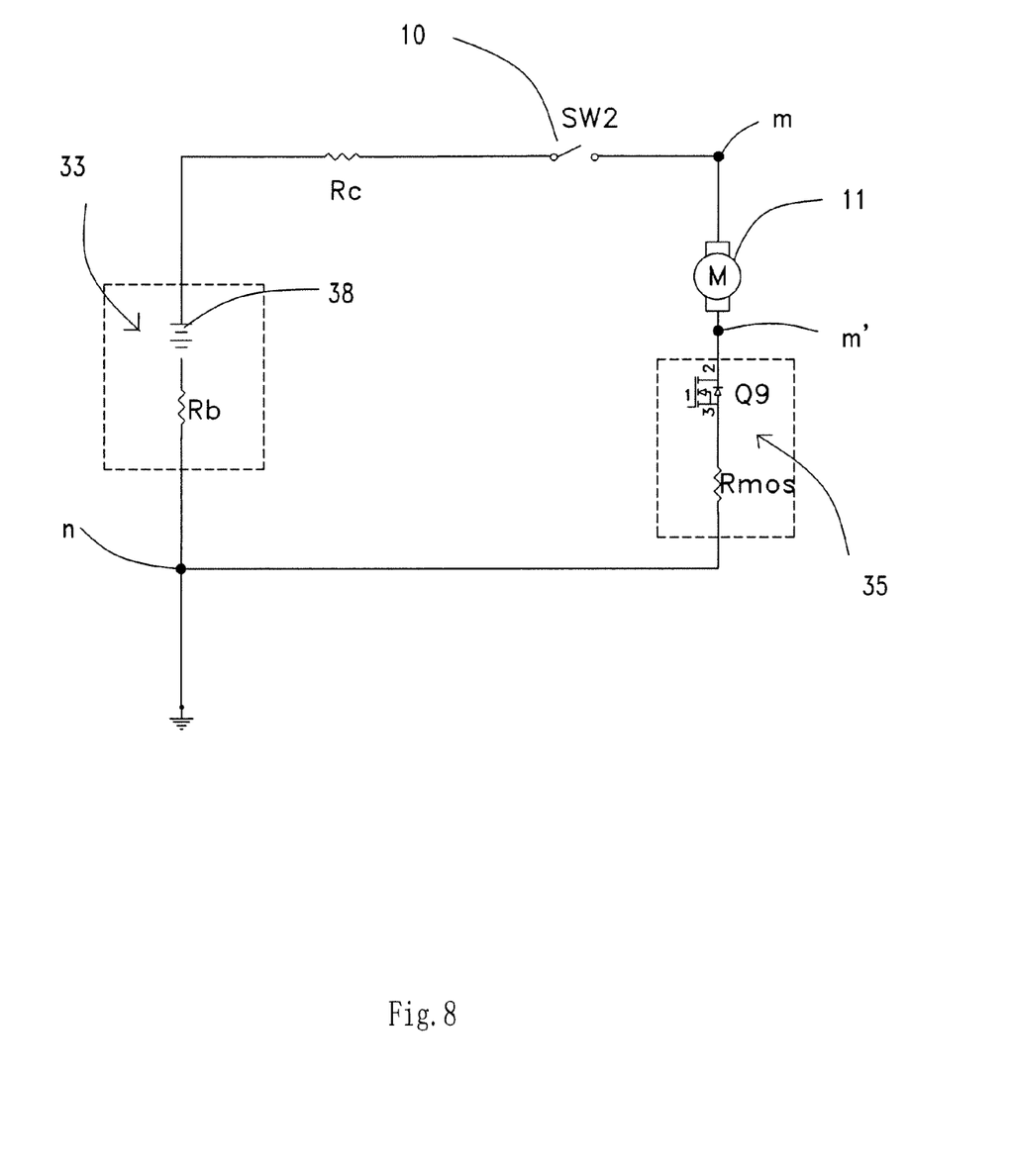

When the voltage detection circuit 29 works, the value of detected voltage V' is a voltage between point m and point n, namely voltage between point m and the ground. The voltage value $V_{mos}$ is voltage between two sides of semiconductor switch 35, namely voltage between point m' and point n. The current value I of this loop is determined by the current measure and by dividing voltage between point m' and point n $V_{mos}$ which is detected by current measure and calculate circuit 30 by the semiconductor switch internal resistance $R_{mos}$.

In the capacity calculating circuit, the relationship of battery pack 33 voltage $V_b$, voltage $V_c$ between two sides of loop internal resistance $R_c$ and detected voltage V' is:

$$V_b = V_c + V'$$

When the power tool is operating, the capacity available to the motor 11 is the capacity of battery pack 33 minus the battery pack internal resistance $R_b$, loop internal resistance $R_c$, and semiconductor switch 35. Therefore, remaining battery capacity displayed by battery capacity displaying devices is decided by open circuit voltage V of battery 38, while the open circuit voltage V of battery 38 is the voltage of battery 33 minus the voltage $V_{Rb}$ which is voltage between two sides of battery pack internal resistance $R_b$. The voltage relationship in battery pack 33 is:

$$V_b = V - V_{Rb}$$

Combining the relational expressions above, the calculating formula of voltage being displayed, namely, open circuit voltage V of battery 38 is:

$$V = V' + V_c + V_{Rb}$$

This results in the voltage being displayed is the summation of detected voltage V', voltage $V_{Rb}$ which is voltage between two sides of battery pack internal resistance $R_b$, and voltage $V_c$ between two sides of loop internal resistance $R_c$. As a result of the same current in the capacity calculating circuit, the value of current is the current value I in the current measure and calculate circuit 30. Putting I into the calculating formula above, the voltage being displayed is:

$$V = V' + I \cdot R_c + I \cdot R_b \cdot C_t$$

This measuring method of the battery capacity considers not only the voltage consumed by battery pack internal resistance $R_b$ and loop internal resistance $R_c$, but also the deviation of the internal battery resistance brought on by the increase in the discharge temperature of the battery. Thus, the open circuit voltage V of battery 38 is more exact, and the display of the battery capacity can be used by motor 11, in fact, is more accurate.

The program then proceeds to display the battery capacity. In displaying the capacity, the status of the remaining battery capacity, obtained in the calculation of the capacity, is indicated to the user via battery capacity indicating device such as LED or LCD or buzzing device. Here, the battery capacity indicating device is a multi-colored LED lamp. In the present embodiment, it is a bicolor LED lamp in red and green, and it is capable of displaying red, orange and green. In case that the remaining battery capacity, obtained in the calculation of the capacity, is larger than or equal to a first predefined capacity value Q1, green is displayed; in the case that the remaining battery capacity is less than or equal to a second predefined capacity value Q2, red is displayed; and in the case where the remaining battery capacity is less than the first predefined capacity value Q1 but larger than the second predefined capacity value Q2, orange is displayed. The first predefined capacity value Q1 is larger than the second predefined capacity value Q2. Preferably, the first predefined capacity value Q1 is 50% of the gross battery capacity, and the second predefined capacity value Q1 is 10% of the gross battery capacity. In this way, the different colors of the lamp correspond to different remaining battery capacities, and the status of the remaining capacity can be clearly indicated to the user. Green stands for full capacity and the user could use the tool normally; red stands for insufficient capacity, and the tool cannot be used and needs recharging; orange stands for medium status, which is that the capacity is not full, but the tool can be used for a certain time. After that, the program returns to the judging for the battery voltage, and repeats this procedure.

Different colors of the capacity indicating lamp can clearly indicate the status of the remaining capacity of the battery to the user, and the user can know whether and how long the tool can operate.

In another example, the multi-colored LED lamp can be replaced by several LED lamps in the same color, such as three LED lamps in green. In case that the remaining battery capacity is larger than or equal to the first predefined capacity value Q1, all of the three lamps are on to indicate the full capacity; in the case that the remaining battery capacity is less than or equal to the second predefined capacity value Q2, only one is on to indicate the insufficient capacity; and in the case that the remaining battery capacity is less than the first predefined capacity value Q1 but is larger than the second predefined capacity value Q2, two are on to indicate the medium capacity.

Before the motor starts operating, the procedure of measuring and displaying the remaining battery capacity detects and judges the various parameters of the battery to determine whether the status of the battery can support the operation of the motor, and this could avoid the influence on the motor caused by the abnormal status of the battery and avoid the occurrence of an emergency. Calculating and displaying the remaining battery capacity after the motor starts operating, repeating the detecting and judging the various parameters of the battery, and calculating and displaying the remaining battery capacity monitors the operational status of the battery in real time and makes the discharge of the battery safer. Detecting and displaying the battery capacity can also be used to make the indication of the remaining battery capacity more accurate.

The remaining battery capacity displaying circuit of power tool, disclosed by the application, is not limited by the aforesaid contents described in the embodiments and structures shown in the drawings. Obvious alternations, replacements or modifications based on the invention to the components thereof fall in the protected scope of the invention.

What is claimed is:

1. A control circuit for a power tool, comprising:
   a detection circuit, electrically connected with a battery pack, which comprises an internal resistance $R_b$ and a temperature factor $C_t$, and configured to measure a voltage between two measuring points (V') and measure the temperature of the battery;
   a calculating control circuit, configured to calculate a calculation result of battery capacity according to the voltage between the two measuring points (V') measured by the detection circuit, and configured to control the power supply for a motor in conjunction with at least the temperature of the battery pack, wherein the calculation result of battery capacity (V) comprises the voltage between two measuring points (V'), a voltage consumed by the battery pack internally ($I \cdot R_b$), and a voltage consumed by the battery in a discharge loop ($I \cdot R_c$), wherein there is a discharge loop internal resistance $R_c$;
   a battery capacity indicating circuit for indicating the calculation result of battery capacity; and,
   a current measure and calculating circuit for measuring a current I flowing through the motor, wherein the formula for calculating the open circuit voltage V of the battery pack is:

$$V = V' + I \cdot R_c + I \cdot R_b \cdot C_t.$$

2. A control circuit for a power tool according to claim 1, wherein the temperature factor $C_t$ is a constant.

3. A control circuit for a power tool according to claim 1, wherein the calculating control circuit comprises a CPU for performing calculations.

4. A control circuit for a power tool according to claim 1, wherein the calculating control circuit comprises a MCU for performing calculations.

5. A control circuit for a power tool according to claim 1, wherein the battery capacity indicating circuit comprises a capacity indicator.

6. A control circuit for a power tool according to claim 5, wherein the capacity indicator is a multicolor LED lamp.

* * * * *